United States Patent
Afzali-Ardakani et al.

(10) Patent No.: US 8,604,559 B2
(45) Date of Patent: Dec. 10, 2013

(54) METHOD OF PLACING A SEMICONDUCTING NANOSTRUCTURE AND SEMICONDUCTOR DEVICE INCLUDING THE SEMICONDUCTING NANOSTRUCTURE

(75) Inventors: Ali Afzali-Ardakani, Ossining, NY (US); Supratik Guha, Chappaqua, NY (US); Cherie R. Kagan, Bala-Cynwyd, PA (US); George S. Tulevski, White Plains, NY (US); Emanuel Tutuc, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/077,216

(22) Filed: Mar. 31, 2011

(65) Prior Publication Data

US 2011/0180777 A1 Jul. 28, 2011

Related U.S. Application Data

(62) Division of application No. 12/195,524, filed on Aug. 21, 2008.

(51) Int. Cl.
*H01L 29/76* (2006.01)
*H01L 29/94* (2006.01)
*H01L 31/062* (2012.01)
*H01L 29/06* (2006.01)
*H01L 31/113* (2006.01)

(52) U.S. Cl.
USPC .............. 257/401; 257/77; 257/9; 257/419; 977/857; 977/742; 977/948

(58) Field of Classification Search
USPC ......... 257/401, 9, 419, 77, 613, 213, 368, 40, 257/347; 977/857, 742, 948
See application file for complete search history.

(56) References Cited

U.S. PATENT DOCUMENTS

| | | | |
|---|---|---|---|
| 6,963,080 B2 | 11/2005 | Afzali-Ardakani et al. | |
| 7,125,989 B2 | 10/2006 | Afzali-Ardakani et al. | |
| 2004/0183070 A1 | 9/2004 | Afzali-Ardakani et al. | |
| 2005/0061451 A1 | 3/2005 | Busnaina et al. | |
| 2005/0287717 A1* | 12/2005 | Heald et al. | 438/128 |
| 2006/0105513 A1 | 5/2006 | Afzali-Ardakani et al. | |
| 2006/0151844 A1 | 7/2006 | Avouris et al. | |
| 2006/0165896 A1 | 7/2006 | Afzali-Ardakani et al. | |
| 2007/0029600 A1* | 2/2007 | Cohen | 257/315 |
| 2007/0032091 A1 | 2/2007 | Heald et al. | |
| 2008/0102213 A1 | 5/2008 | Afzali-Ardakani et al. | |

FOREIGN PATENT DOCUMENTS

WO WO 2007/074339 A1 7/2007
WO WO 2008/011623 A2 1/2008

OTHER PUBLICATIONS

United States Office Action dated Aug. 17, 2011 in U.S. Appl. No. 12/195,524.
PCT International Search Report dated May 4, 2009.
PCT Written Opinion of the International Searching Authority.

(Continued)

*Primary Examiner* — Chuong A. Luu
(74) *Attorney, Agent, or Firm* — Vazken Alexanian; McGinn IP Law Group, PLLC

(57) ABSTRACT

A semiconductor device includes a bonding surface, a semiconducting nanostructure including one of a nanowire and a nanocrystal, which is formed on the bonding surface, and a source electrode and a drain electrode which are formed on the nanostructure such that the nanostructure is electrically connected to the source and drain electrodes.

17 Claims, 10 Drawing Sheets

(56) References Cited

OTHER PUBLICATIONS

Bo, et al., "Pentacene-Carbon Nanotubes: Semiconducting Assemblies for Thin-Film Transistor Applications", Applied Physics Letters, AIP, American Institute of Physics, Melville, NY, US, vol. 87, No. 20, Nov. 10, 2005, pp. 203510-1-203510-3.
United States Office Action dated May 25, 2011 in U.S. Appl. No. 12/113,064.
Cao, et al., "Transparent flexible organic thin-film transistors that use printed single walled carbon nanotube electrodes", Applied Physics Letters 88, p. 113511, 2006.
Tsukagoshi, et al. "Pentacene nanotransistor with carbon nanotube electrodes", Applied Physics Letters, vol. 85, No. 6, 2004, pp. 1021-1023.
Chemistry, Seventh Edition, Chang, McGraw-Hill Companies, 2002, pp. 419-421.
Gotovac, et al. "Effect of Nanoscale Curvature of Single-Walled Carbon Nonotubes on Adsorption of Polycyclic Aromatic Hydrocarbons", Nano Letters, 2007, vol. 7, No. 3, pp. 583-587.
United States Office Action dated Feb. 29, 2012 in U.S. Appl. No. 12/113,064.
Klarner, et al., "Synthesis and Supramolecular Structures of Molecular Clips", Tetrahedron, vol. 57 (2001), pp. 3673-3687.
Tromp, et al., "Novel Strategy for Diamter-Selective Separation and Functionalization of Single-Wall Carbon Nanotubes", Nano Letters 2008, vol. 8, No. 2, pp. 469-472.
United States Office Action dated Jul. 13, 2012 in U.S. Appl. No. 12/113,064.
United States Office Action dated Feb. 28, 2013 in U.S. Appl. No. 12/113,064.
United States Office Action dated Sep. 10, 2013, in U.S. Appl. No. 13/617,420.

* cited by examiner

METHOD OF PLACING A SEMICONDUCTING NANOSTRUCTURE AND SEMICONDUCTOR DEVICE INCLUDING THE SEMICONDUCTING NANOSTRUCTURE

CROSS REFERENCE TO RELATED APPLICATIONS

The present application is related to U.S. patent application Ser. No. 11/044,885, to Afzali-Ardakani et al., entitled "SELECTIVE PLACEMENT OF CARBON NANOTUBES ON OXIDE SURFACES" (U.S. Patent Pub. No. 20060165896), and U.S. patent application Ser. No. 11/324,441, to Afzali-Ardakani et al., entitled "SELECTIVE PLACEMENT OF CARBON NANOTUBES THROUGH FUNCTIONALIZATION" (U.S. Patent Pub. No. 2008/0102213), which are commonly assigned with the present Application and is incorporated by reference herein.

The present application is a Divisional application of U.S. patent application Ser. No. 12/195,524, which was filed on Aug. 21, 2008.

BACKGROUND OF THE INVENTION

1. Field of the Invention

The present invention relates to a method of placing a functionalized semiconducting nanostructure and, more particularly, a method of placing a functionalized semiconducting nanostructure which includes functionalizing a semiconducting nanostructure with an organic functionality including a functional group for bonding to a bonding surface.

2. Description of the Related Art

One-dimensional nanostructures such as silicon nanowires (SNW) are attractive building blocks for assembly of nanoelectronic and nanophotonic systems. Nanowires are particularly attractive because their electronic and optical properties can be tailored by controlling their diameter through synthesis.

Semiconductor nanowires have been utilized to construct various devices including, for example, field-effect transistors, logic gates, sensors, photodiodes and lasers. To use a nanowires in an integrated circuit or optical device, the nanowire must be properly positioned (e.g., accurately positioned) on a surface (e.g., a substrate surface).

In particular, semiconducting nanostructures (e.g., nanowires and nanocrystals) can be used as the "channel" material in a field-effect transistor (FET). The most common related art method of fabricating a nanostructure FET deposits the nanostructure on a substrate (e.g., an oxide thin film) from a liquid suspension. Source and drain contacts are then formed lithographically on the nanostructure.

However, fabrication of integrated circuits from nanostructures requires the precise placement and alignment of large numbers of nanostructures on a surface (e.g. spanning source and drain contacts). Currently, it is difficult to precisely position a nanostructure such as a nanowire or nanocrystal on a surface.

SUMMARY OF THE INVENTION

In view of the foregoing and other problems, disadvantages, and drawbacks of the aforementioned structures and methods, the exemplary aspects of the present invention provides, inter alia, a method of placing a functionalized semiconducting nanostructure, which includes functionalizing a semiconducting nanostructure including one of a nanowire and a nanocrystal, with an organic functionality including a functional group for bonding to a bonding surface, dispersing the functionalized semiconducting nanostructure in a solvent to form a dispersion, and depositing the dispersion onto the bonding surface.

Another exemplary aspect of the present invention is directed to a semiconductor device including a semiconducting nanostructure. The device includes a bonding surface, a semiconducting nanostructure including one of a nanowire and a nanocrystal, which is formed on the bonding surface, and a source electrode and a drain electrode which are formed on the nanostructure such that the nanostructure is electrically connected to the source and drain electrodes.

Another exemplary aspect of the present invention is directed to a method of forming a semiconductor device including forming a bonding surface, and forming a semiconducting nanostructure including one of a nanowire and a nanocrystal, on the bonding surface. Forming the semiconducting nanostructure includes placing a functionalized semiconducting nanostructure by functionalizing a semiconducting nanostructure including one of a nanowire and a nanocrystal, with an organic functionality including a functional group for bonding to a bonding surface, dispersing the functionalized semiconducting nanostructure in a solvent to form a dispersion, depositing the dispersion onto the bonding surface, and annealing the nanostructure to remove the organic functionality from the nanostructure. The method further includes forming a source electrode and a drain electrode on the nanostructure such that the nanostructure is electrically connected to the source and drain electrodes.

With its unique and novel features, the exemplary aspects of the present invention may provide an effective and efficient method of placing a functionalized semiconducting nanostructure.

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF THE EXEMPLARY EMBODIMENTS OF THE INVENTION

Figure 1:
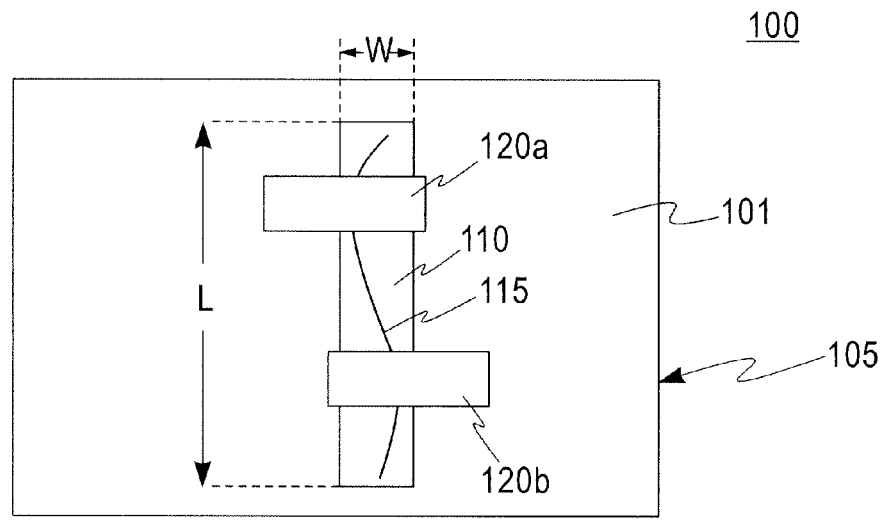
FIG. 1 illustrates a semiconductor device 100, according to an exemplary aspect of the present invention.

Referring now to the drawings, FIGS. 1-10 illustrate the exemplary aspects of the present invention.

FIG. 1 provides a planar view of a semiconductor device 100 according to an exemplary aspect of the present invention. The device 100 includes a substrate 105, a bonding surface 110 (e.g., a patterned metal oxide layer) having a length, L, and a width, W, formed on the substrate 105, and a semiconducting nanostructure 115 (e.g., nanowire or nanocrystal) formed on the bonding surface 110 (e.g., selectively placed on a patterned metal oxide layer).

The device 100 may also include a contact such as source and drain contacts 120a, 120b, respectively, formed on the substrate 105 and on the semiconducting nanostructure 115. Thus, for example, the semiconductor device 100 may include a field effect transistor (FET), and the nanostructure 115 may serve as a channel region of the FET.

The nanostructure 115 may be selectively placed (e.g., positioned) on the bonding surface 110 by functionalization. That is, an organic functionality having a functional group for bonding to the bonding surface 110 may be formed on the nanostructure 115. The nanostructure 115 may then be placed (e.g., precisely positioned) on the bonding surface 110 by depositing the nanostructure 115 on the bonding surface so that the organic functionality bonds to the bonding surface 110.

The positioning of the nanostructure 115 may follow the shape and orientation of the bonding surface 110. In particular, the bonding surface 110 may have a rectangular shape (e.g., L>W) so that when the nanostructure 115 is deposited on the bonding surface 110, the nanostructure 115 bonds to the bonding surface 110 such that the longitudinal axis of the nanostructure 115 is substantially aligned with the longitudinal direction (i.e., L) of the bonding surface 110.

After placing the functionalized nanostructure on the bonding surface 110, the organic functionality may be removed from the nanostructure 115 such as by annealing the device 100.

The substrate 105 may also include a non-bonding surface 101 to which the functional group has little potential for bonding (e.g., will not bond). For example, if the nanostructure 115 is functionalized with an organic acid functionality, the bonding surface 100 may include a metal oxide surface and the non-bonding surface 101 may include a silicon oxide surface. In addition, as illustrated in FIG. 1, the non-bonding surface 101 may be formed around a periphery of the bonding surface 110, from a plane view perspective.

Further, the non-bonding surface 101 may include plural non-bonding surfaces 101 including different types of materials. Further, the non-bonding surface 101 may include substantially the entire uppermost surface of the substrate, except for the portion which includes the bonding surface 110. That is, in this aspect, the uppermost surface of the substrate 105 includes either the bonding surface 110 or the non-bonding surface 101. In this case, there is no surface, other than the bonding surface 110, on the uppermost surface of the substrate 105 to which the functionalized nanostructure 115 will bond.

An important aspect of the present invention is the bonding surface 110. In order to ensure that the nanostructure (e.g., a single nanostructure) is placed such that the longitudinal axis of the nanostructure is formed along the length (L) of the bonding surface, the length (L) should be at least greater than the width (W) of the bonding surface. In an exemplary aspect, the bonding surface 110 may have a width in a range from 10 nm to 500 nm, and a length in a range from 1 μm to 100 μm.

Further, the length (L) and width (W) of the bonding surface may depend to a certain extent on the length ($l_N$) of the nanostructure to be placed on the bonding surface, and the diameter ($d_N$) of the nanostructure. For example, the length (L) should be at least 10 times the length ($l_N$) of the nanostructure, and more preferably, at least 100 times the length ($l_N$) of the nanostructure, and the width (W) should be less than 1000 times the diameter ($d_N$) of the nanostructure and more preferably, less than 100 times the diameter ($d_N$) of the nanostructure, to ensure, for example, that the nanostructure is precisely placed (e.g., longitudinally placed and not transversely placed) on the bonding surface.

Thus, for example, where the nanostructure is a silicon nanowire having a length of 10 μm and a diameter of 10 nm, the dimensions of the bonding surface may be L>100 μm, W<10,000 nm, or more preferably, L>1000 μm, W<1,000 nm.

In addition, the bonding surface (e.g., metal oxide layer) should have a sufficient thickness but not be so thick that the nanostructure bonds to the side of the bonding surface and not an upper surface of the bonding surface as intended. Thus, the bonding surface should have a thickness in a range from 1 nm to 100 nanometers.

Figure 2:
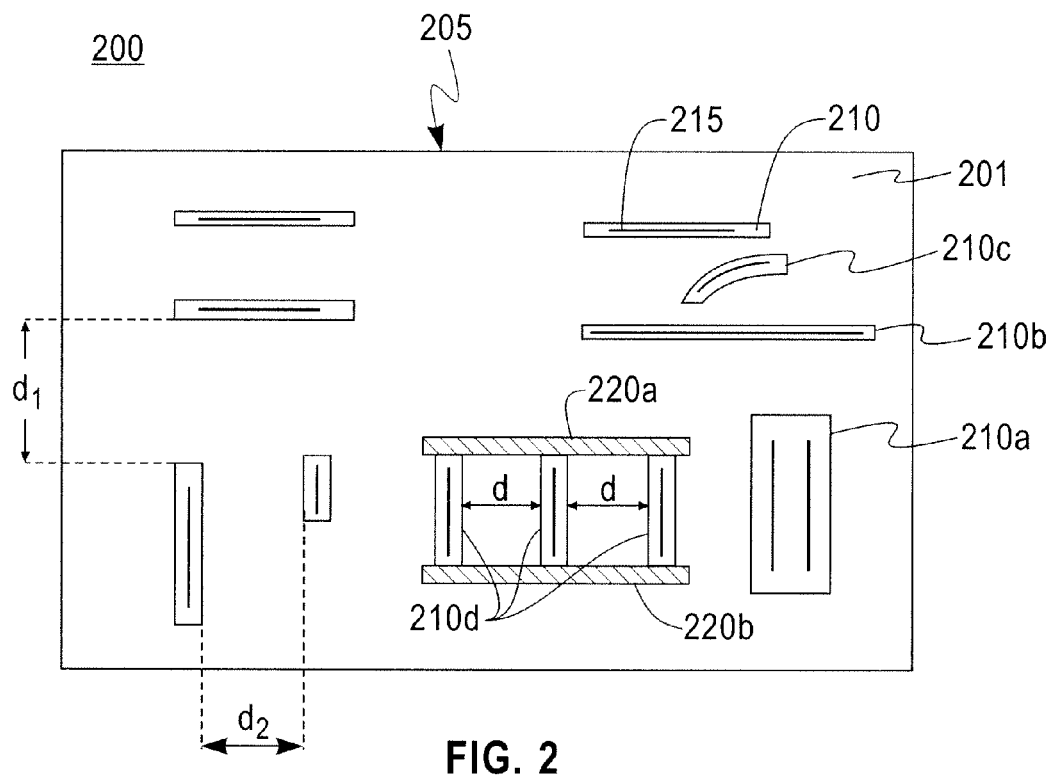
FIG. 2 illustrates a semiconductor device 200, according to an exemplary aspect of the present invention.

FIG. 2 illustrates a semiconductor device 200 in which plural bonding surfaces 210 are formed on a substrate 205 and semiconducting nanostructures 215 are formed on the bonding surfaces 210. The device 200 also includes non-bonding surfaces 201 which are formed around the periphery of the bonding surfaces 210.

As illustrated in FIG. 2, the bonding surfaces 210 may have the same or different lengths or widths and may be separated by the same or different distances (e.g., $d_1$, $d_2$). In this exemplary aspect, in order to ensure that the nanostructure is precisely placed (e.g., does not cross from one bonding surface to another bonding surface), the distance between the bonding surfaces (e.g., $d_1$, $d_2$) should be at least greater than the length (e.g., the greatest length) of the nanostructures.

In addition, one or more nanostructures may be formed on a single bonding surface. The number of nanostructures which are formed on the bonding surface may be controlled by controlling the width (W) of the bonding surface. For example, to form a single nanostructure on the bonding surface, the width (W) should be less than 100 times the diameter ($d_N$) of the nanostructure. To form two nanostructures on the bonding surface (e.g., bonding surface 210a in FIG. 2), the width (W) of the bonding surface should be in a range from 100 to 200 times the diameter ($d_N$) of the nanostructure, and so on. The nanostructures may also be formed end-to-end on the bonding surface (e.g., bonding surface 210b in FIG. 2).

It should also be noted that the nanostructure (e.g., silicon nanowire) may be flexible. Thus, the bonding surface may include a curved bonding surface (e.g., bonding surface 210c), in which case the nanostructure may be bonded to the bonding surface and include a bend which may correspond to at least some degree to the curvature of the bonding surface.

In another exemplary aspect, plural bonding surfaces such as bonding surfaces 210d may be formed parallel on the substrate 205. Source and drain electrodes 220a, 220b may then be formed on the bonding surfaces 210d and contacting the nanostructures 215 formed thereon. In this case, the distance, d, formed between the plural bonding surfaces 210d should be at least greater than the length (e.g., the greatest length) of the nanostructures 215.

Figure 3:
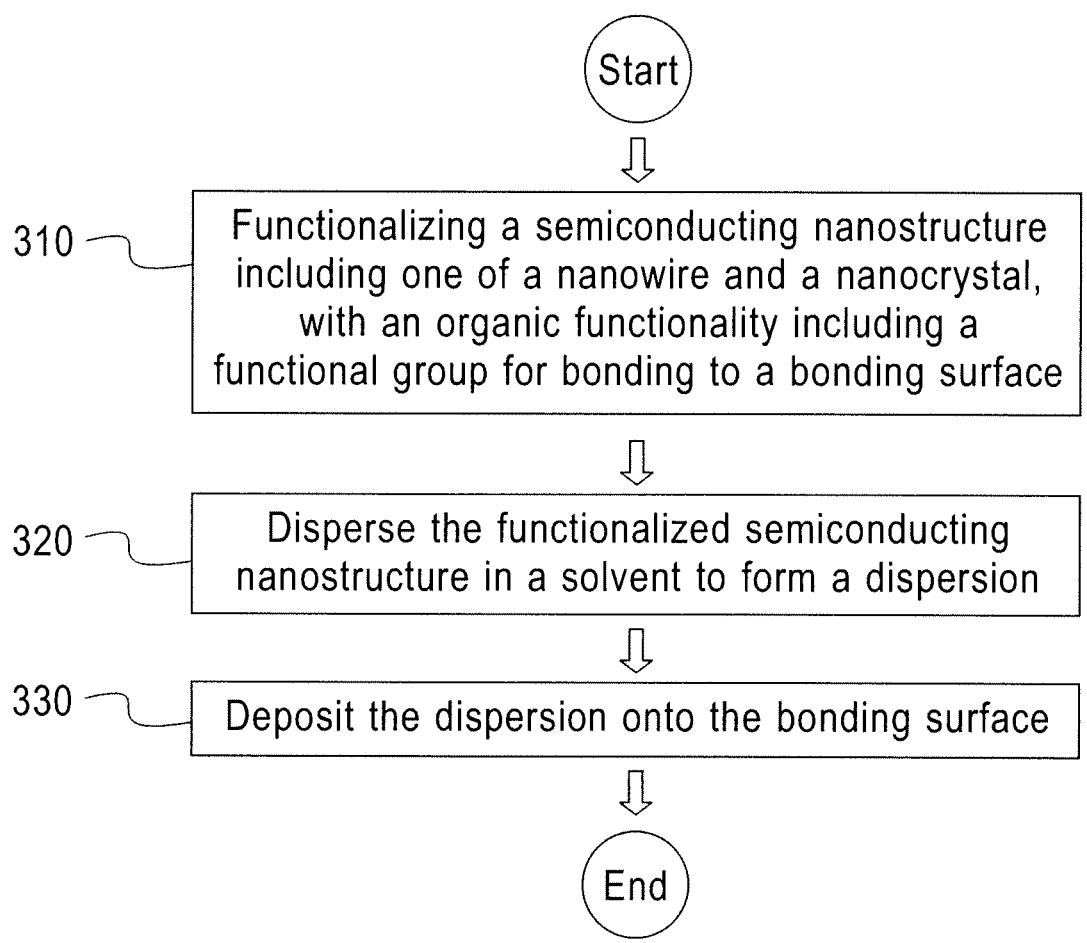
FIG. 3 illustrates a method 300 of placing a semiconducting nanostructure through functionalization, according to an exemplary aspect of the present invention.

FIG. 3 illustrates a method 300 of placing a semiconducting nanostructure through functionalization. The method includes functionalizing (310) a semiconducting nanostructure including one of a nanowire and a nanocrystal, with an organic functionality including a functional group for bonding to a bonding surface, dispersing (320) the functionalized semiconducting nanostructure in a solvent (e.g., aqueous or organic solvent) to form a dispersion, and depositing (330) the dispersion onto the bonding surface.

A more detailed explanation of the exemplary aspects of the semiconductor device and the method of forming the semiconductor device follows.

The Semiconducting Nanostructure

The nanostructure may include for example, a semiconducting nanowire or a semiconducting nanocrystal. The nanostructure may have a substantially cylindrical shape and a diameter which is in a range from 5 nm to 100 nm, and a length in a range from 1 μm to 100 μm.

The nanostructure may be doped (e.g., with boron, phosphorus, etc.) or undoped. The nanostructure may also include materials from Groups III, IV, V and VI of the periodic table, such as Si, Ge, SiGe, Sn, Se, Te, B, P, As, Sb, Bi, AlN, AlP, AlAs, AlSb, GaAs, GaP, GaSb, InN, InP, InAs, InSb, $In_2O_3$, $In_2S_3$, $In_2Se_3$, $In_2Te_3$, CdS, CdSe, CdTe, ZnO, ZnS, ZnSe, ZnTe, SnO, SnS, SnSe, SnTe, HgS, HgSe, HgTe, GeS, GeSe, GeTe, PbO, PbS, PbSe, PbTe, $Sb_2S_3$, $Sb_2Se_3$, $Sb_2Te_3$ and combinations thereof.

The term "nanowire" herein may refer to a highly anisotropic semiconductor crystal. The anisotropy of the nanowire is reflected in the external structure (i.e., morphology) of the nanowire. The nanowire may include a filamentary crystal with a very high aspect ratio (greater than 10) of length, L, to diameter, d. For example, silicon nanowires with lengths of L=0.1 microns to 30 microns, and diameters d=100 nm to 3 nm are typical.

The semiconductor nanowire may be synthesized by catalytic growth, which is typically carried out in a chemical vapor deposition (CVD) or plasma enhanced chemical vapor deposition (PECVD) chamber. The growth temperature depends on the semiconductor and the precursor used. For example, silicon nanowires are typically grown at a growth temperature from about 370° C. to about 500° C. when silane ($SiH_4$) is used. For silicon tetrachloride ($SiCl_4$), the growth temperature is from about 800° C. to about 950° C. By adding chlorine to $SiH_4$, the growth temperature can be raised to above 600° C. The growth rate of the nanowire depends on the growth temperature and the gas pressure in the growth chamber. Using the example of silicon nanowires, a typical CVD growth rate for $SiH_4$ diluted with $H_2$ (1:1) at a pressure of 1 ton and a growth temperature of 450° C. is about 7.6 μm/hour.

The anisotropic growth of the nanowire is believed to be best described by the vapor-liquid-solid (VLS) mechanism. Taking a silicon nanowire as an example, when the growth is initiated, a catalyst-silicon liquid alloy is formed. With additional supply of Si from the gas phase (e.g., $SiH_4$), the liquid droplet becomes supersaturated with Si and the excess silicon is deposited at the solid-liquid interface. As a result, the liquid droplet rises from the original substrate surface to the tip of a growing nanowire crystal. If the growth temperature is kept below the decomposition temperature of the Si precursor (about 500° C. if $SiH_4$ is used), no deposition of silicon take places on the nanowire sidewalls (i.e., no radial growth). As a result, the only growth taking place is that enabled by the metallic catalyst (e.g., gold) which leads to anisotropic growth.

Figure 4:
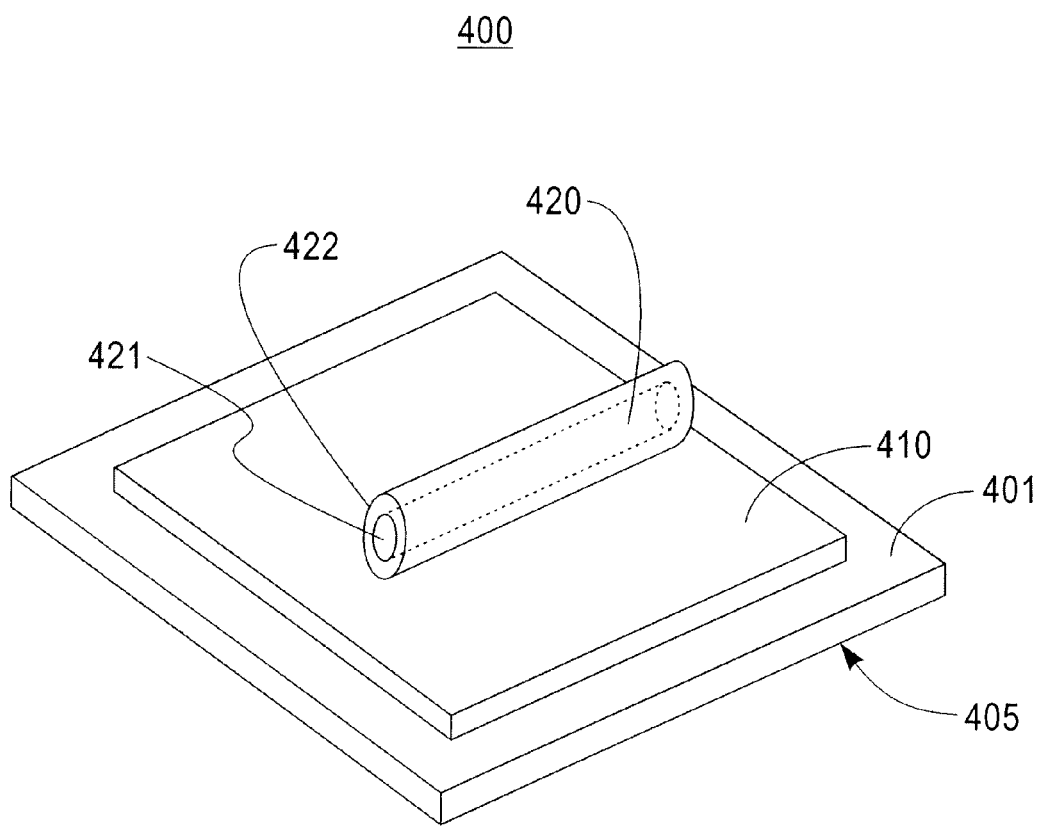
FIG. 4 illustrates a semiconductor device 400, according to an exemplary aspect of the present invention.

The nanowire may include a solid nanowire having substantially the same material throughout (e.g., a silicon nanowire). The nanowire may also have a "core-shell" configuration. For example, FIG. 4 illustrates a semiconductor device 400 including a substrate 405, a bonding surface 410 and non-bonding surface 401 formed on the substrate 405, and a nanowire 420 having a "core-shell" configuration, according to an exemplary aspect of the present invention. The nanowire 420 may include a core 421 which includes a first material and shell 422 which is formed on the outer surface of the core 421 and includes a second material that is different from the first material. It should be noted that more than two layers may included in the nanowire 420 (e.g., the core 421 and/or shell 422 may include plural layers).

In particular, the semiconductor device 400 may include a phase change memory device in which the core 421 may include a first phase-change material (e.g., $Ge_2Sb_2Te_5$), and the shell 422 may include a second phase-change material (e.g., GeTe) which is different from the first phase-change material. Further, contacts could be formed on the nanowire 420 to apply an electric field to the nanowire to heat the nanowire and switch the core 421 and shell 422 between a crystalline and amorphous state. This may allow the nanowire to have a first electrical resistance where the core and shell are crystalline, a second resistance where the core and shell are amorphous, and a third resistance where one of the core and shell is crystalline and the other is amorphous, so that the memory device 400 may store three bit values (e.g., "0", "1" and "2").

The nanowire may also include group III-V semiconductor compound (e.g., GaN, InN, GaAs), in which case the nanowire may form a light-emitting nanowire which serves as a light-emitting layer in a light-emitting device (e.g., a light-emitting diode (LED)). The light-emitting nanowire may be tuned to emit light of varying wavelengths (e.g., different colors of light including red, green and blue). In an exemplary aspect, for example, the nanowire includes InN and is about 100 nm wide and less than 100 micrometers long and may emit infrared light.

The nanowire (e.g., silicon or Group III-V semiconductor nanowire) may also serve as a photodiode in photodetector or an image capture device (e.g., camera, copier, scanner), or to convert solar energy into electricity in a photovoltaic cell.

Functionalizing the Semiconducting Nanostructure

In order to obtain the functionalized nanostructure (e.g., a Si, Ge, or Si/Ge nanowire), the nanostructure may be first washed (e.g., with hydrofluoric acid, ammonium fluoride, etc.) to dissolve the native surface oxide that may have formed on the nanostructure, and then the washed nanostructure may be functionalized (e.g., by reacting the surface of the nanostructure with a diazonium salt).

Figure 5A:
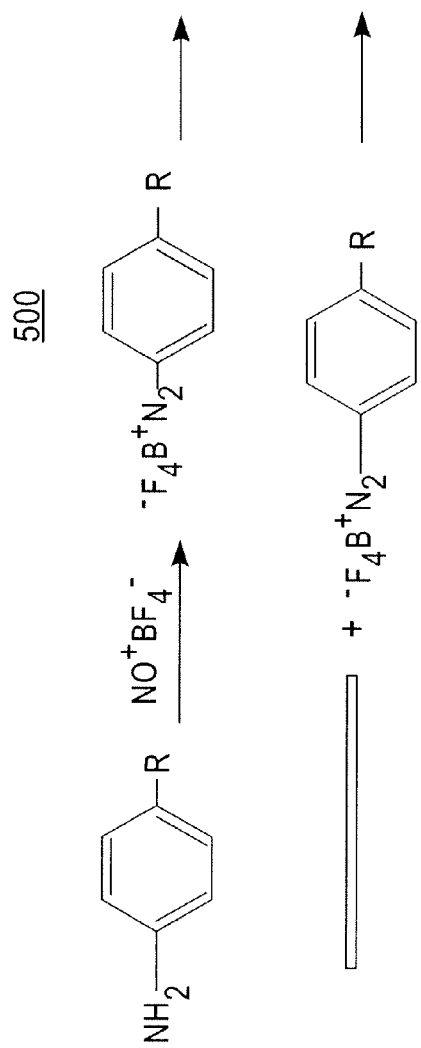
FIGS. 5A-5B illustrate two exemplary methods 500, 550 for providing a functionalized semiconducting nanostructure, according to an exemplary aspect of the present invention.
Figure 5B:
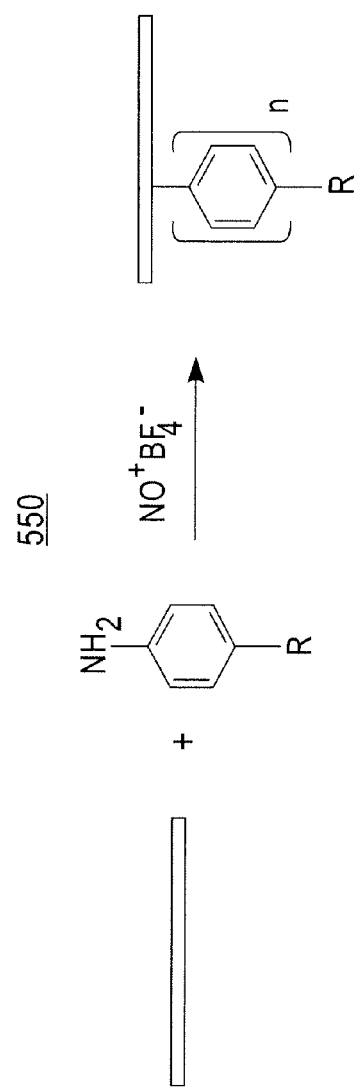

FIGS. 5A-5B illustrate two exemplary methods 500, 550 for providing a functionalized semiconducting nanostructure, according to an exemplary aspect of the present invention. The "n" in the nanostructure of FIGS. 5A-5B may represent the number organic functionalities which may be attached to the nanostructure. This number "n" may vary depending upon the "functionalized surface area" of the nanostructure. In an exemplary aspect, the number "n" may be in a range from 1 molecule per square nm of nanostructure to 10 molecules per square nm of functionalized surface area.

In methods 500, 550, the nanostructure (e.g., nanowire), may be functionalized by using an organic molecule which includes two functional groups (e.g., on opposing ends of the molecule). The first functional group may be used to react with the surface of the nanostructure and the second functional group may stabilize a solution of nanostructures, and also allow the functionalized nanostructure to be selectively placed (e.g., accurately positioned) on a surface (e.g., a pre-patterned surface).

In particular, the second functional group may also be chosen to stabilize the nanostructures such that the nanostructures may form a stable dispersion (e.g., an aqueous dispersion or a dispersion in an organic solvent). Although there have been reports of methods of forming aqueous dispersions of nanostructures (e.g., nanowires and nanocrystals) using quaternary ammonium salts, these methods do not form a sufficiently stable dispersion and, in addition, cannot be used in the selective placement of nanostructures.

The first functional group in FIGS. 5A-5B is an aryl diazonium salt (e.g., —Ar—$N_2^+BF_4^-$), and the second functional group is represented by "R" which may be bonded (e.g., covalently bonded) to a bonding surface of the semiconductor device. For example, where the bonding surface includes a metal oxide, the second functional group "R" may include an organic acid (carboxylic, hydroxamic, boronic or phosphonic) functionality. The organic acid functionality may help to solubilize the nanowires in water or lower alcohols, and have affinity for the formation of chemical bonds with the bonding surface (e.g., a metal oxide surface).

In method 500, for example, a precursor organic compound that contains an aminoaryl functional moiety (R—Ar—$NH_2$) is reacted with nitrosonium tetrafluoroborate ($NO^+BF_4^-$) in acetonitrile (or sodium nitrite in acid solution) to form a corresponding aryldiazonium tetrafluoroborate (R—Ar—$N_2^+BF_4^-$) functionality. The aryldiazonium tetrafluoroborate (R—Ar—$N_2^+BF_4^-$) functionality is then reacted with the surface of a semiconducting nanostructure to form the functionalized semiconducting nanostructure.

The method 550 is similar to method 500 but more condensed, in that the semiconducting nanostructure is introduced together with the aminoaryl functional moiety (R—Ar—$NH_2$) and with nitrosonium tetrafluoroborate ($NO^+BF_4^-$) in acetonitrile, to form the functionalized semiconducting nanostructure.

The exemplary aspects of FIGS. 5A, 5B should not be considered as limiting. That is, the nanostructure may be "functionalized" by using any of a group of novel bi-functional organic compounds that have been designed and synthesized by the inventors of the present invention. The organic compounds include at least two functional groups, the first of which can form a bond (e.g., a covalent bond) with a nanostructure, and the second of which may bond selectively to a particular surface, but not to another surface (e.g., bond to a metal oxide, but not to silicon oxide).

Such bi-functional organic compounds, after being bonded (e.g., covalently bonded) to a nanostructure via their first functional groups, effectively functionalize the nanostructure with their second functional groups. Therefore, the functionalized nanostructure can selectively bond to a surface of a particular substrate (e.g., a metal oxide) via the second functional group of the organic functionality, but not to a surface of another substrate (e.g., silicon oxide). Excess nanostructures that have not formed selective bonds (e.g., with the metal oxide) can then be removed (e.g., by washing).

The first functional group of the organic compounds of the present invention may include, for example, an aromatic or heteroaromatic functional moiety having at least one diazonium salt substituent, with or without additional substituent(s). The aromatic or heteroaromatic ring of this first functional group can form a bond (e.g., a Si—C bond where the nanostructure outer surface includes silicon, a Ge—C bond where the nanostructure outer surface includes germanium, a In—C bond when the nanostructure outer surface includes indium, etc.) with a nanostructure with the assistance of the at least one diazonium salt substituent, thereby bonding (e.g., covalently bonding) the organic functionality to the nanostructure.

The aromatic or heteroaromatic functional moiety may include from about 1 to about 12 rings. The heteroaromatic functional moiety can include one of the following as the heteroatom: nitrogen, sulfur, oxygen or combinations thereof. The aromatic or heteroaromatic functional moiety may include a diazonium salt substituent (—$N_2^+$), which can react with a nanostructure to facilitate the formation of the bond between the nanostructure and the aromatic or heteroaromatic ring.

In particular, the first functional group may include an aryldiazonium functional moiety (—Ar—$N_2^+$) or a substituted aryldiazonium functional moiety with one or more additional substituents. In particular, the first functional group may include a phenyldiazonium moiety or a substituted phenyldiazonium moiety with at least one alkyl substituent, as follows:

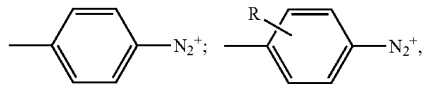

where R is an alkyl group with from about 1 to about 12 carbon atoms.

The second functional group of the organic compounds of the present invention may include any suitable organic functional moiety that has more potential for bonding to a bonding surface than to another surface (e.g., a surface formed adjacent to the bonding surface). Preferably, the organic functional moiety would not bond to the other surface. For example, where the bonding surface includes a metal oxide bonding surface and the other surface includes a silicon oxide, the second functional group may include an organic acid functional moiety selected from the group consisting of carboxylic acids, hydroxamic acids, boronic acids and phosphonic acids.

The first and second functional groups of the organic compounds can either be directly linked together by a bond (e.g., a single covalent bond), or be linked together by a linker, which may include from 0 to 20 carbon atoms and which can be linear, branched, or cyclic. In particular, the first and second functional groups of the organic compounds are linked together by a linker selected from the group consisting of —O—, —S—, —NH—, C1-C20 alkyl, halogenated or partially halogenated C1-C20 alkyl, C1-C20 alkyloxy, C1-C20 alkylthiol, C1-C20 alkylamino, C1-C20 cycloalkyl, C1-C20 cycloalkyloxy, C1-C20 alkenyl, halogenated or partially halogenated C1-C20 alkenyl, C1-C20 alkenyloxy, C1-C20 alkenylthiol, C1-C20 alkenylamino, C1-C20 cycloalkenyl, C1-C20 cycloalkenyloxy, C1-C20 alkyl, and C1-C20 alkyloxy. Preferably, the linker is a linear C1-C20 alkyloxy, and most preferably, the linker is either an undecyloxy or a dodecyloxy.

Particularly preferred organic compounds of the present invention include:

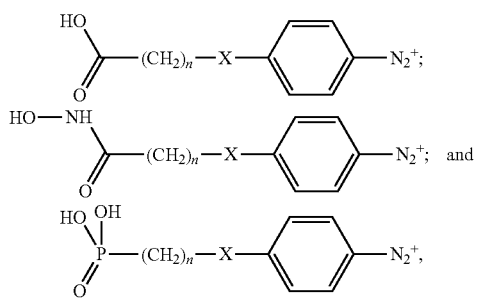

where n ranges from about 0 to about 20, and X is either a single bond or is selected from the group consisting of O, S, and NH.

These preferred organic compounds can be readily formed from the following precursor compounds:

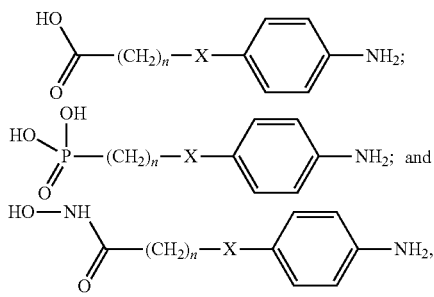

by reacting the precursor compounds with nitrosonium tetrafluoroborate ($NO^+BF_4^-$) in acetonitrile.

The organic compounds as described hereinabove may then be reacted with nanostructures to form functionalized nanostructures with the organic functionality bonded (e.g., covalently bonded) thereto.

It should be noted that the mechanism for bonding an organic functionality to the nanostructure is exemplary. That is, there may be other mechanisms that could be used to bond the organic functionality (e.g., organic acid functionality) to the nanostructure besides the use of an aryldiazonium salt, so long as the resulting structure forms a stable dispersion in an aqueous and/or organic solvent.

Forming the Dispersion

In a particularly preferred embodiment of the present invention, the functionalized nanostructures are dispersed in one or more aqueous or organic solvents, to form a dispersion of nanostructures. The solvent may include, for example, chloroform, tetrachloroethane, tetrahydrofuran (THF), toluene, ethyl acetate, methyl ethyl ketone (MEK), dimethyl formamide, dichlorobenzene, propylene glycol monomethyl ether acetate (PGMEA) or mixtures of any of these. The solution of functionalized nanostructures may then be sonicated and centrifuged to remove un-functionalized nanowires as sediment.

In an exemplary aspect, the dispersion is prepared by sonication of nanostructures in an organic solvent (such as, for example, C1-C3 alcohols, dichloroethylene, N-methylpyrolidone or dichloromethane) or in an aqueous solution that contains from about 0.1 to about 1% of a surfactant. Examples of surfactants that can be used in preparing the aqueous dispersion of nanostructures include sodium dodecylbenzenesulfonic acid (SDS) and poly(oxyethylene)-substituted aromatic compounds such as Triton N-100 or Triton X-100.

Depositing the Dispersion to Selectively Place the Functionalized Semiconducting Nanostructure The dispersion may then be deposited on a substrate, for example, by spin coating, drop cast, etc. The dispersion may be deposited, for example, in the area of the bonding surface of the substrate.

In an exemplary aspect, the substrate surface can be simply immersed in such a dispersion for a sufficient period of time to allow the second functional group of the organic functionality to selectively bond to the bonding surface. In this manner, the functionalized nanostructures are selectively placed on the bonding surface portion of the substrate surface.

As noted above, where the second functional group of the organic functionality attached to the nanostructure includes an organic acid functional group, such as —$CO_2H$, —CONHOH or —$PO_3H_2$, the bonding surface may include a metal oxide and the non-bonding surface of the substrate may include silicon oxide.

For example, in an exemplary aspect, the bonding surface may include a metal oxide including at least one metal from group IVB, VB, VIIB, VIIB, VIII or IIA (CAS version) of the Periodic Table of Elements. In particular, the metal oxide of the present invention may be selected from $Al_2O_3$, $HfO_2$, $TiO_2$, $SnO_2$ or $ZrO_2$. The metal oxide may be formed on another dielectric material or a semiconducting material.

The bonding surface may be formed adjacent to the non-bonding surface and, in particular, may be surrounded by the non-bonding surface. Thus, in an exemplary aspect, the substrate surface may include either a uniform, unpatterned metal oxide layer, or a patterned metal oxide region located adjacent to or on a $SiO_2$ region. In particular, the substrate surface may include a metal oxide layer formed on at least one portion thereof. For example, the metal oxide layer may include a high-k dielectric layer such as aluminum oxide and/or hafnium oxide, and may have a thickness ranging from about 1 nm to about 100 nm.

The method of placing the functionalized semiconducting nanostructure according the exemplary aspects of the present invention may achieve not only an excellent site-specific bonding of the functionalized nanostructure to the bonding surface, but also can be used to align the functionalized nanostructures to the contours of a narrow surface feature.

Figure 6:
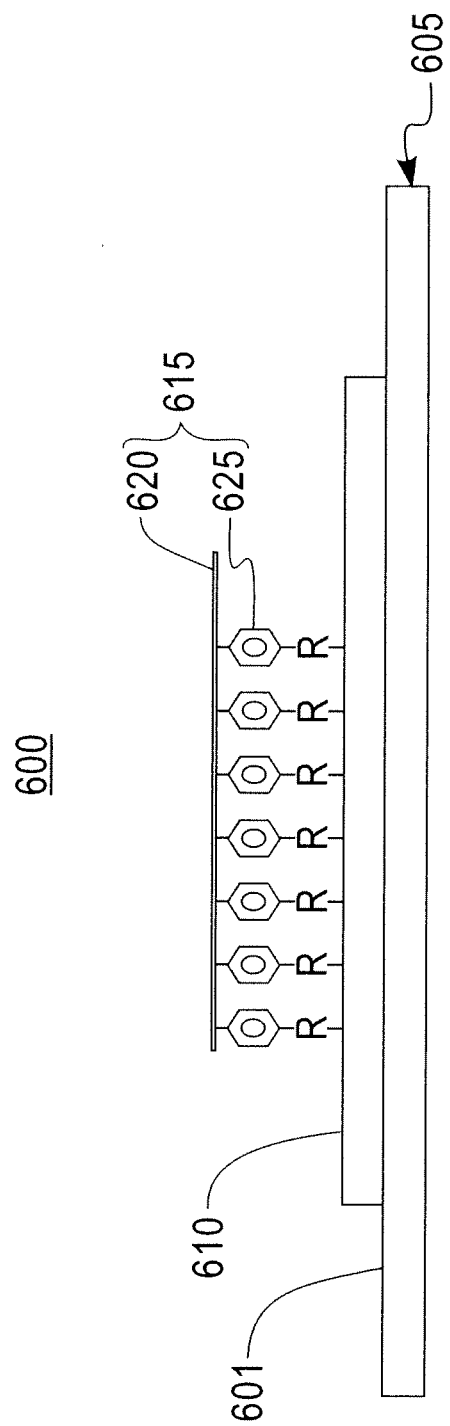
FIG. 6 illustrates a cross-sectional view of an exemplary aspect of a semiconductor device 600, according to an exemplary aspect of the present invention.

FIG. 6 illustrates a cross-sectional view of an exemplary aspect of a semiconductor device 600 according to an exemplary aspect of the present invention. The device 600 includes a substrate 605 including a bonding surface 610 and a non-bonding surface 601, and a functionalized nanostructure 615. As illustrated in FIG. 6, the functionalized nanostructure 615 includes a nanostructure 620 and an organic functionality 625 including a functional group, R (e.g., an organic acid functional group, such as —$CO_2H$, —CONHOH, —$B(OH)_2$ or —$PO_3H_2$) which is bonded to the bonding surface 610.

In this exemplary aspect, the organic functionality 625 includes a phenyl group in which a hydrogen atom is substituted by the functional group, R. However, the organic functionality 625 many instead include other functional groups as described in more detail below.

Figure 7A:
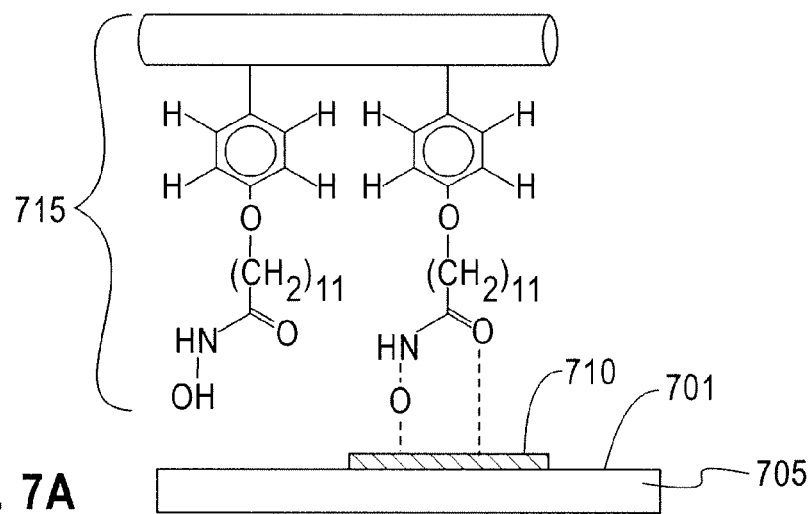
FIGS. 7A-7C illustrates a functionalized nanostructure 715 and a substrate 705 having a non-bonding surface 701, and a bonding surface 710 to which the nanostructure 715 is bonded, according to an exemplary aspect of the present invention.
Figure 7B:
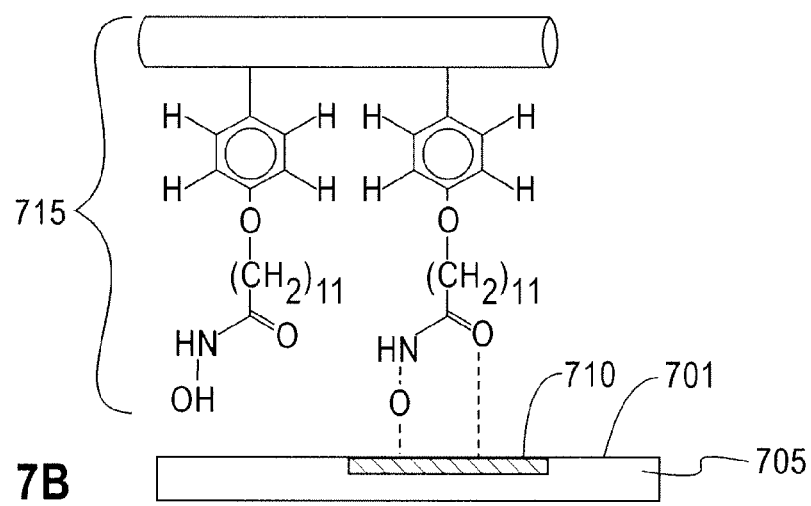
Figure 7C:
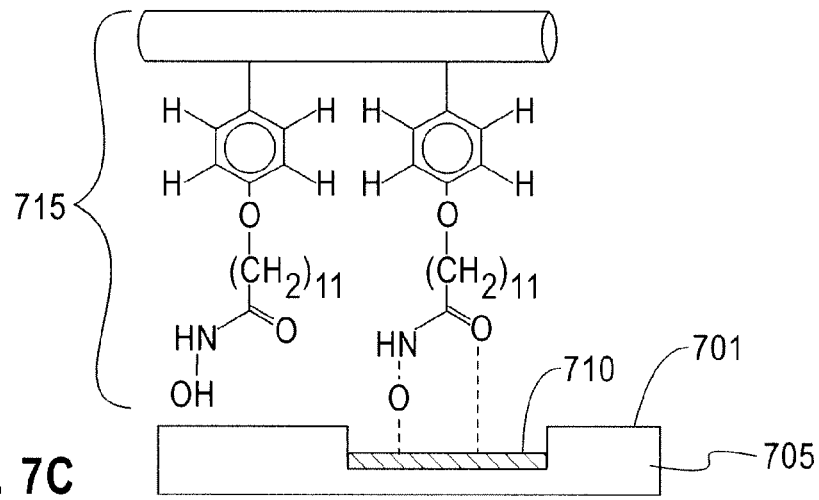

FIGS. 7A-7C illustrate a functionalized nanostructure 715 and a substrate 705 having a non-bonding surface 701, and a bonding surface 710 to which the nanostructure 715 is bonded, according to an exemplary aspect of the present invention. FIGS. 7A-7C provide a more detailed explanation of how the functionalized nanostructure 715 may be selectively placed on a surface. As illustrated in FIGS. 7A-7C, in this exemplary aspect, the functionalized nanostructure 715 is functionalized with an organic functionality which includes a functional group, R (e.g., —CONHOH) which has more potential for bonding with the bonding surface 710 than with non-bonding surface 701 of the substrate 705 (e.g., the functional group, R, may bond with the bonding surface 710 but not with non-bonding surface 701 of the substrate 705).

It should be noted that although the bonding surface 710 is illustrated in FIG. 7A (e.g., and FIG. 6) as being formed on the substrate 705, the upper surface of the bonding surface 710 may instead be coplanar with the upper surface of the substrate (e.g., the non-bonding surface 701) as illustrated in FIG. 7B, or may be formed below the upper surface of the substrate (e.g., the non-bonding surface 701) as illustrated in FIG. 7C.

In addition, the substrate 705 may include a conductive, non-conductive or semiconducting substrate. The substrate 705 may also include plural layers or plural substrates. That is, a portion of the bonding surface 710 may be formed on a first layer of the substrate and another portion may be formed on a second layer of the substrate which includes a different material than the first layer.

In addition, although the organic functionality may be illustrated as being formed on only a portion of the nanostructure which faces the bonding surface, in fact the organic functionality may be formed over most of the surface of the nanostructure.

Additional Processing

After depositing the dispersion to selectively place the functionalized nanostructure, excess functionalized nanostructures that have not yet bonded to the bonding surface may be removed from the substrate surface. For example, the substrate surface can be washed with one or more clean solvents, or it can be sonicated in one or more clean solvents.

After the excess functionalized nanostructures have been removed, additional processing can also be performed to remove the organic functionality from the nanostructure which has bonded to the bonding surface. This may help to improve the physical and electrical properties of the nanostructure.

That is, functionalizing the nanostructure may form a dense, amorphous layer of the organic functionality on a surface of the nanostructure. However, after placing the functionalized nanostructure, this layer may be removed (e.g., completely removed) by annealing.

For example, in one case, after annealing in a nitrogen-containing environment at an annealing temperature from about 500° C. to about 600° C. for about 120 seconds to about 60 minutes, the amorphous layer disappeared, and the nanostructure appeared remarkably clean, with little or no defects. The structural integrity of the nanostructures may also be maintained during the annealing process.

The specific annealing conditions for practicing the present invention can be varied widely, depending on the specific types of nanostructures used. For nanostructures with an average diameter ranging from about 5 nm to about 20 nm (measured before the functionalization), the annealing temperature may range from about 450° C. to about 650° C., more preferably from about 500° C. to about 600° C., and the annealing duration may range from about 60 seconds to about 120 minutes, and more preferably from about 120 seconds to about 60 minutes.

Forming a Semiconductor Device by Using the Functionalized Semiconducting Nanostructure As noted above, the selectively placed nanostructure may be used for fabricating semiconductor devices such as field effect transistors (FETs), memory devices, light-emitting devices (e.g., light-emitting diodes), photodetectors, imaging devices, solar cells, etc.

FIGS. 8A-8E illustrate a method 800 of forming a semiconductor device (e.g., an FET having a nanostructure channel), according to an exemplary aspect of the present invention.

Figure 8A:
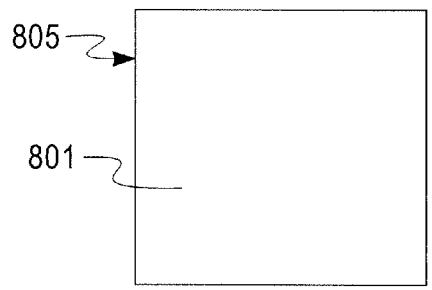
FIGS. 8A-8E illustrate a method 800 of forming a semiconductor device (e.g., an FET having a nanostructure channel), according to an exemplary aspect of the present invention.

Specifically, the method 800 includes providing a substrate 805 (e.g., a $SiO_2$ substrate), as shown in FIG. 8A. The substrate 805 may include a non-bonding surface 801 (e.g., a $SiO_2$ surface).

Figure 8B:
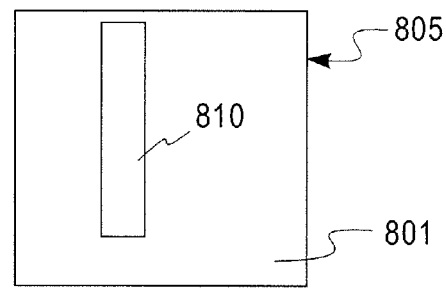

A bonding surface 810 may then be formed on the substrate by forming a metal layer (e.g., a patterned aluminum strip) having a thickness of about 40 nm and a width of about 300 nm is then formed on the substrate 805, and then exposing the substrate 805 to an oxygen plasma (e.g., for about 3 minutes at about 600 mTorr), to oxidize the surface of the metal layer to form a metal oxide layer 810 (e.g., a bonding surface which may include, for example, an $Al_2O_3$ layer), as illustrated in FIG. 8B. The metal oxide layer 810 (e.g., bonding surface) may protect the underlying metal from being oxidized and also separate the underlying metal from the nanostructure to be deposited.

Figure 8C:
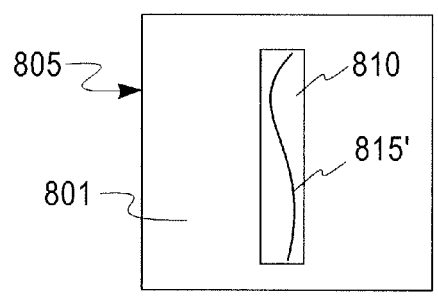

A dispersion including functionalized semiconducting nanostructure 815' in an aqueous or organic solvent may then be deposited on the substrate 805, such that the functionalized semiconducting nanostructure 815' is selectively bonded to the metal oxide layer 810, as illustrated in FIG. 8C.

Figure 8D:
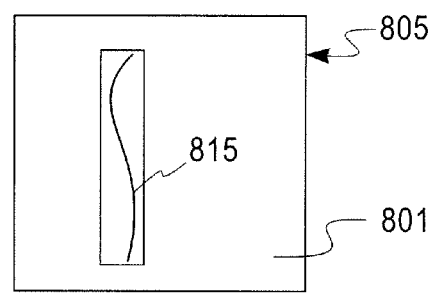
Figure 8E:
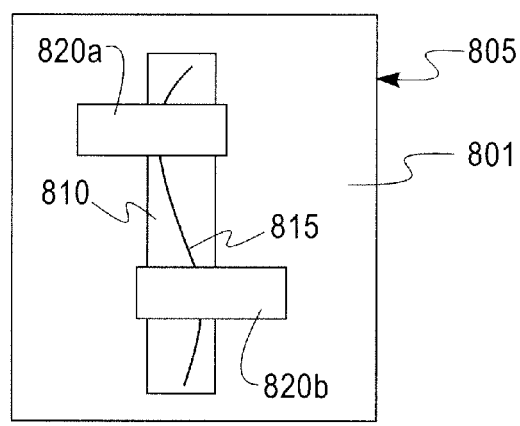
Figure 9C:
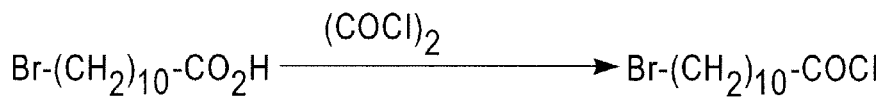
FIG. 9 illustrates a method of preparing synthetic a bi-functional compound that includes a hydroxamic acid moiety and a diazonium moiety, according to an exemplary aspect of the present invention.
Figure 9C:
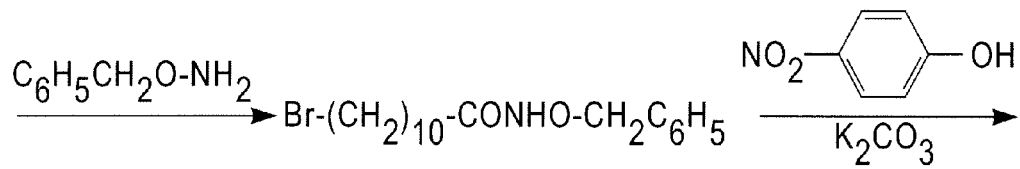
Figure 9D:
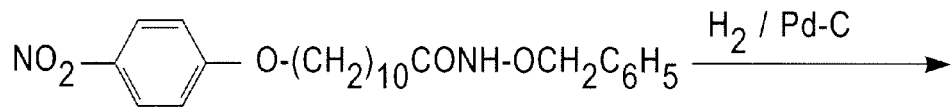
Figure 9E:
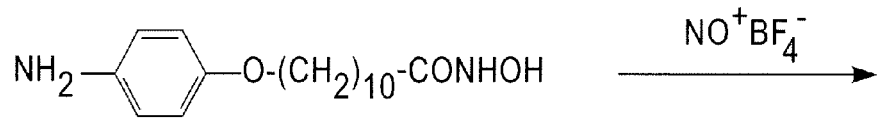
Figure 9F:
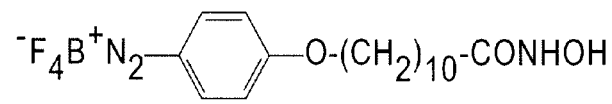
Figure 10C:
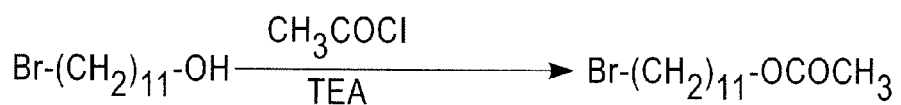
FIG. 10 illustrates a synthetic scheme for preparation of a bi-functional compound that includes a phosphonic acid moiety and a diazonium moiety, according to an exemplary aspect of the present invention.
Figure 10C:
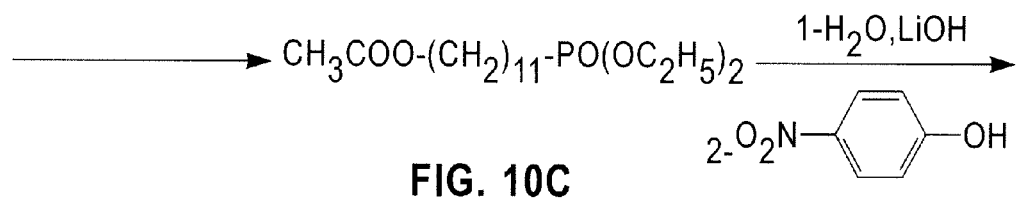
Figure 10D:
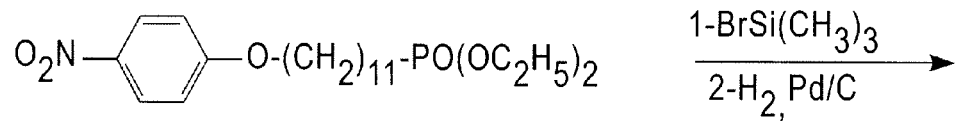
Figure 10E:
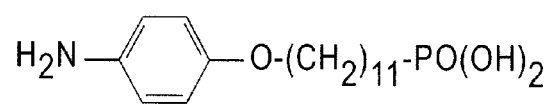

The device may then be annealed in $N_2$ to remove the organic functionality from the functionalized semiconducting nanostructure 815', thereby forming a semiconducting nanostructure 815 (e.g., a pristine nanostructure) on the $Al_2O_3$ surface layer 24, as shown in FIG. 8(D).

Finally, a lithographic step may be carried out to deposit source and drain contacts 820(a) and 820(b) over the substrate 805 in direct contact with two ends of the nanostructure 815. In this manner, a nano-sized FET device may be formed, in which the unreacted Al metal may function as the back gate, the $Al_2O_3$ surface layer 810 may function as the gate dielectric, and the nanostructure 815 may function as the channel.

The channel length of a FET formed by the method of the present invention may be set based on the distance between the source and drain contacts 820a, 820b formed on the nanostructure 815. The channel length may typically ranges from about 50 nm to about 1000 nm, more typically from about 100 nm to about 500 nm, and most typically from about 350 nm to about 450 nm.

The following examples are provided to illustrate the various processing schemes of the present invention for the selective placement of nanostructures.

EXAMPLE 1

Preparation of a Bi-Functional Organic Compound with a Hydroxamic Acid Functional Moiety and a Diazonium Functional Moiety FIG. 9 illustrates a method of preparing synthetic a bi-functional compound that includes a hydroxamic acid moiety and a diazonium moiety. First, 11-bromo-1-undecanoic acid (9a) is converted to corresponding acid chloride (9b), which is then reacted with O-benzylhydroxylamine to form O-benzyl-10-bromodecylhydroxamic acid (9c). Reaction of 9c with 4-nitrophenol in the presence of potassium carbonate results in the formation of O-benzyl-10-(4-nitrophenoxy)decylhydroxamic acid (9d). Hydrogenation of 9d forms 10-(4-aminophenoxy)decylhydroxamic acid (9e), which reacts with nitrosonium tetrafluoroborate in acetonitrile to form the compound (9f), which contains a diazonium salt moiety at one end and a hydroxamic acid moiety at the other end.

In a specific experiment, oxalyl chloride (0.02 mole) was added to a solution of 0.01 mole 10-bromo-1-decanoic acid (9a) in dichloromethane containing traces of N,N-dimethylformamide and stirred for 4 hours. Excess oxalyl chloride was removed under reduced pressure, and the remaining oily acid chloride was dissolved in 50 mL dichloromethane and added to a solution of O-benzylhydroxylamine in dichloromethane containing 0.01 mole of triethylamine and the mixture was stirred at room temperature. The mixture was washed with dilute hydrochloric acid and brine, dried over anhydrous magnesium sulfate and the solvent was removed under reduced pressure to give desired protected hydroxamic acid (i.e., O-benzyl-10-bromodecylhydroxamic acid of 9c). Crystallization from ethanol afforded pure sample of 9c.

Potassium carbonate (5.0 grams) was added to a solution of 4-nitrophenol (0.01 mole) and the compound 9c (0.01 mole) in N,N-dimethylformamide (10 mL) and the mixture was heated at 110 C. under nitrogen for 18 hours. The mixture was cooled to room temperature. Water (100 mL) was added and extracted with diethyl ether. The ether extract was washed with dilute potassium hydroxide solution, brine and dried over anhydrous magnesium sulfate and evaporated under reduce pressure. The solid residue was crystallized from toluene to give the compound 9d (i.e., O-benzyl-10-(4-nitrophenoxy)decylhydroxamic acid) as light yellow crystals.

Palladium on carbon (10%, 200 mg) was added under nitrogen to a solution of the compound 9d (0.01 mole) and ammonium formate (0.05 mole) in anhydrous methanol (50 mL), and the mixture was heated to reflux for 4 hours. The solution was filtered, and the solvent was removed to give form the compound 9e (10-aminophenoxy-1-decylhydroxamic acid) as white crystalline compound.

EXAMPLE 2

Preparation of a Bi-Functional Organic Compound with a Phosphonic Acid Functional Moiety and a Diazonium Functional Moiety FIG. 10 illustrates a synthetic scheme for preparation of a bi-functional compound that includes a phosphonic acid moiety and a diazonium moiety. First, 11-Bromo-1-undecanol (10a) is esterified with acetyl chloride and then reacted with triethylphosphite to form the phosphonate (10c). Deprotection of acetyl group and reaction of 4-nitrophenol in the presence of triphenyl phosphine and diethyl azodicarboxylate results in the formation of 11-nitrophenoxyundecyl phosphonate (10d). Reduction of nitro group to amine and hydrolysis of phosphonate to phosphonic acid then form O-benzyl 11-(4-nitrophenoxy)undecylphosphonic acid (10e). Hydrogenation of 10e can then form 11-(4-aminophenoxy)undecylhydroxamic acid (not shown), which in turn reacts with nitrosonium tetrafluoroborate in acetonitrile to form a compound (not shown) that contains a diazonium salt moiety at one end and a phosphonic acid moiety at the other end.

EXAMPLE 3

Preparation of a Dispersion of Functionalized Nanostructures

Silicon nanowires were first etched in a dilute ammonium fluoride buffer solution for 30 seconds and then immersed in an acetonitrile solution of diazonium salt prepared from compound 9e (60 mg) and nitrosonium tetrafluoroborate (18 mg) in anhydrous acetonitrile, and the mixture was kept at room temperature for 30 minutes and then rinsed with acetonitrile. The diazonium salt of 10-(4-aminophenoxy)-1-decylhydroxamic acid functionalized the nanostructures by forming a covalent silicon-carbon bond with the nanostructures through the phenyl ring, without destroying the lattice structure of the nanostructures.

The functionalized nanostructures were then isolated by addition of large amounts of acetone, followed by centrifugation. Supernatant liquid was discarded, and the precipitated nanostructures were then dispersed in methanol to form stable dispersion of functionalized nanostructures, which stayed isolated in the dispersion for several weeks.

EXAMPLE 4

Selective Bonding of Functionalized Nanostructures to Substrate Surface with Metal Oxide A patterned $Al_2O_3$ layer was formed on a $SiO_2$ substrate by depositing a patterned Al film over the substrate, and then oxidizing the Al film using an oxygen plasma. The patterned $Al_2O_3$ layer was about 4 nm thick. The substrate was then immersed in a dispersion of functionalized nanostructures in methanol, as described in EXAMPLE 3, and heated to 50 C. The substrate was subsequently removed from the dispersion and sonicated in clean methanol, followed by drying in a stream of nitrogen. A deposition of functionalized nanostructures exclusively on aluminum oxide surface was resulted.

It should be noted that the above Examples 1-4 are meant to be illustrative and should not be considered as limiting the present invention in any manner.

Other Aspects

The exemplary aspects of the present invention may be used to fabricate multi-gate structures such as finFETs, tri-gate transistors and surround gate (e.g., gate-all-around) FETs.

Figure 11:
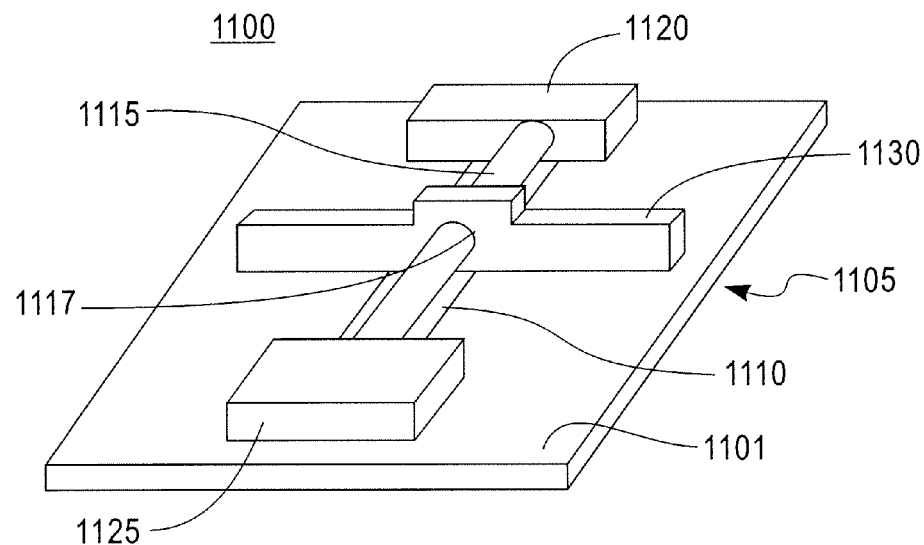
FIG. 11 illustrates a finFET 1100 (e.g., a nanowire finFET), according to an exemplary aspect of the present invention.

FIG. 11 illustrates a finFET 1100 (e.g., a nanowire finFET) according to an exemplary aspect of the present invention. The finFET 1100 may be fabricated by forming a bonding surface 1110 (e.g., metal oxide) on a substrate 1105 having a non-bonding surface 1101 (e.g., silicon oxide), and then placing a semiconducting nanostructure 1115 (e.g., silicon nanowire) on the bonding surface 1110 using the method of the present invention (e.g., method 300). Then, the source 1120 and drain 1125 are formed on opposing ends of the nanostructure 1115. Then, a gate insulating layer 1117 (e.g., high-k dielectric layer) is formed on the nanostructure 1115, and the gate 1130 (e.g., polysilicon) is formed on the gate insulating layer 1117 to form the finFET 1100.

Figure 12:
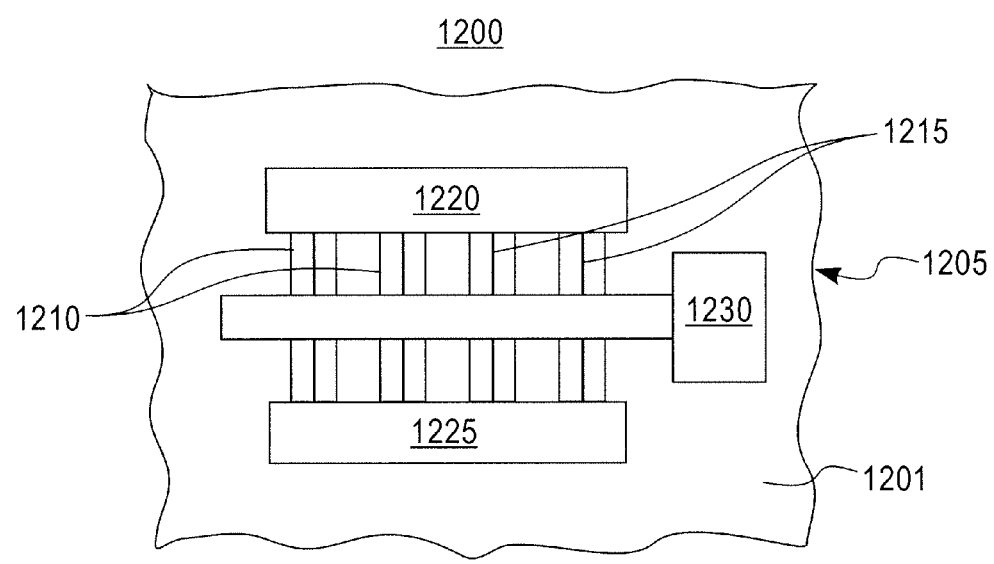
FIG. 12 illustrates a MOSFET 1200, according to an exemplary aspect of the present invention.

FIG. 12 illustrates a MOSFET 1200 according to another exemplary aspect of the present invention. The MOSFET 1200 may be fabricated, for example, by forming plural bonding surfaces 1210 (e.g., metal oxide) on a substrate 1205 having a non-bonding surface 1201 (e.g., silicon oxide), and then placing a semiconducting nanostructure 1215 (e.g., silicon nanowire) on the plural bonding surfaces 1210 using the method of the present invention (e.g., method 300). Then, the source 1220 and drain 1225 are formed on opposing ends of the nanostructure 1215, a gate insulating layer (e.g., high-k dielectric) is formed on the nanostructure 1215, and the gate 1230 (e.g., polysilicon) is formed on the gate insulating layer to form the surround gate MOSFET 1200.

With its unique and novel features, the exemplary aspects of the present invention may provide an effective and efficient method of placing a functionalized semiconducting nanostructure.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim in the present application should be construed as a disclaimer of any interest in or right to an equivalent of any element or feature of the amended claim.

What is claimed is:

1. A semiconductor device, comprising:
    a substrate;
    a metal layer formed on the substrate;
    a metal oxide layer formed on the metal layer and including a bonding surface having a width and a length which is greater than the width;
    a semiconducting nanostructure including one of a nanowire and a nanocrystal, which is formed on said bonding surface, a lengthwise direction of the nanostructure being substantially aligned with the length of the bonding surface; and
    a source electrode and a drain electrode which are formed transversely across said nanostructure in a direction perpendicular to the lengthwise direction, such that said nanostructure is electrically connected to said source and drain electrodes.

2. The semiconductor device of claim 1, wherein said semiconductor device comprises a field-effect transistor (FET), said nanostructure forming a channel region between said source and drain electrodes.

3. The semiconductor device of claim 1, wherein said metal layer comprises a back-gate of said field effect transistor (FET).

4. The semiconductor device of claim 1, wherein said bonding surface comprises a width in a range from 10 nm to 500 nm, and a length in a range from 1 μm to 100 μm.

5. The semiconductor device of claim 4, wherein said bonding surface comprises a metal oxide and said non-bonding surface comprises silicon oxide.

6. The semiconductor device of claim 1, wherein said bonding surface is formed on a substrate which comprises a non-bonding surface formed adjacent to said bonding surface.

7. The semiconductor device of claim 1, wherein said semiconductor device comprises one of a memory device, a logic gate, an optical sensor, a photodiode and a laser.

8. The semiconductor device of claim 1, further comprising:
    a substrate, the bonding surface being formed on the substrate; and
    a non-bonding surface which is formed on the substrate, wherein the non-bonding surface is formed around a periphery of the bonding surface.

9. The semiconductor device of claim 8, wherein the non-bonding surface has less potential for bonding with an organic acid functionality than the bonding surface.

10. The semiconductor device of claim 1, wherein the bonding surface and the non-bonding surface are formed on an uppermost surface of the substrate.

11. The semiconductor device of claim 1, wherein said bonding surface comprises a width which is not more than 100 times a width of said nanostructure such that not more than one nanostructure is bonded to said bonding surface.

12. The semiconductor device of claim 1, wherein the nanostructure comprises a nanowire, and the source and drain electrodes are formed on the nanowire and transversely across the nanowire and the bonding surface.

13. The semiconductor device of claim 1, wherein the nanostructure comprises a width and a length which is greater than the width of the nanostructure, and the length of the bonding surface is at least 10 times the length of the nanostructure.

14. The semiconductor device of claim 1, wherein the nanostructure comprises plural nanostructures which are formed on the bonding surface, a lengthwise direction of the plural nanostructures being substantially aligned with the length of the bonding surface.

15. The semiconductor device of claim 14, wherein the plural nanostructures which are formed one of end-to-end along at least a portion of the length of the bonding surface, and parallel along at least a portion of the length of the bonding surface.

16. A semiconductor device, comprising:
    a substrate;
    a metal layer formed on the substrate;
    a metal oxide layer formed on the metal layer and including a bonding surface formed on the substrate and having a width and a length which is greater than the width;
    a non-bonding surface which is formed on the substrate, the non-bonding surface being formed around a periphery of the bonding surface and having less potential for bonding with an organic acid functionality than the bonding surface;
    a semiconducting nanostructure including one of a nanowire and a nanocrystal, which is formed on the bonding surface, a lengthwise direction of the nanostructure being substantially aligned with the length of the bonding surface; and
    a source electrode and a drain electrode which are formed transversely across the nanostructure and the bonding surface in a direction perpendicular to the lengthwise direction, such that the nanostructure is electrically connected to the source and drain electrodes.

17. A field-effect transistor (FET), comprising:
    a substrate:
    a metal layer formed on the substrate;
    a metal oxide layer formed on the metal layer and including a bonding surface having a width and a length which is greater than the width;
    a channel region comprising a semiconducting nanostructure including one of a nanowire and a nanocrystal, which is formed on the bonding surface, a lengthwise direction of the nanostructure being substantially aligned with the length of the bonding surface; and
    a source electrode and a drain electrode which are formed transversely across the nanostructure in a direction perpendicular to the lengthwise direction, such that the nanostructure is electrically connected to the source and drain electrodes.

* * * * *